(12) United States Patent
Sarikaya

(10) Patent No.: US 10,513,659 B2
(45) Date of Patent: Dec. 24, 2019

(54) FIRE PROOF COMPOUND AND USES OF THE FIRE PROOF COMPOUND

(71) Applicant: Mahmut Sarikaya, Washington, DC (US)

(72) Inventor: Mahmut Sarikaya, Washington, DC (US)

(*) Notice: Subject to any disclaimer, the term of this patent is extended or adjusted under 35 U.S.C. 154(b) by 0 days.

(21) Appl. No.: 15/588,354

(22) Filed: May 5, 2017

(65) Prior Publication Data

US 2017/0321123 A1 Nov. 9, 2017

Related U.S. Application Data

(60) Provisional application No. 62/391,633, filed on May 5, 2016.

(51) Int. Cl.
| | |
|---|---|
| *C09K 21/02* | (2006.01) |
| *C04B 22/06* | (2006.01) |
| *C04B 22/14* | (2006.01) |
| *C04B 28/14* | (2006.01) |
| *C09D 5/18* | (2006.01) |
| *H05K 9/00* | (2006.01) |
| *C04B 103/63* | (2006.01) |
| *C04B 111/00* | (2006.01) |

(52) U.S. Cl.
CPC ............ *C09K 21/02* (2013.01); *C04B 22/064* (2013.01); *C04B 22/142* (2013.01); *C04B 28/14* (2013.01); *C09D 5/18* (2013.01); *H05K 9/0092* (2013.01); *C04B 2103/63* (2013.01); *C04B 2111/00258* (2013.01)

(58) Field of Classification Search
CPC .................................. C09K 21/02; C09D 5/18
See application file for complete search history.

(56) References Cited

U.S. PATENT DOCUMENTS

2018/0009994 A1* 1/2018 Kreh ....................... C04B 28/04

* cited by examiner

*Primary Examiner* — Peter F Godenschwager
(74) *Attorney, Agent, or Firm* — John Dodds

(57) ABSTRACT

A fire proof compound is provided including $MgSO_4.7H_2O$ ($Mg_4Si_6O_{15}(OH)_2.6H_2O$) CaO (s)+$H_2O$ (l)$\leftrightarrows$Ca(OH)$_2$ (aq) ($\Delta H_r=-63.7$ kJ/mol of CaO) ($CaSO_4.2H_2O$) $H_4Mg_2Si_3O_{10}$). The compound can be added to a gypsum substrate of a wallboard to manufacture a fire proof wallboard. The compound can also be mixed with a paint to provide a fire proof paint. In certain composition, the compound can also exhibit an electromagnetic field blocking property. An existing wallboard manufacturing process line can be modified to accept the additional process of adding the compound to the gypsum substrate of the wallboard.

11 Claims, 2 Drawing Sheets

FIRE PROOF COMPOUND AND USES OF THE FIRE PROOF COMPOUND

CROSS-REFERENCE TO RELATED APPLICATION

This application claims the benefit of U.S. Provisional Patent Application Ser. No. 62/391,633, filed May 5, 2016, which is incorporated herein in its entirety.

FIELD OF THE INVENTION

The present invention relates generally to fire proof material, and more particularly, to a fire proof compound having a fire proof property for a variety of applications including a fire proof wallboard used in construction of interior walls and ceilings.

BACKGROUND OF THE INVENTION

Wallboard, sheetrock, drywall, and other terms are common names given to panels constructed from gypsum and cardboard. These panels are used extensively in the construction of interior residential, commercial, and industrial walls, floors, and ceilings to produce flat walls and other important surfaces. A sheet of drywall is typically produced by putting gypsum, which is essentially a type rock that was turned into a powder, in between two pieces of incredibly thick paper. Gypsum drywall is sold commercially in a variety of sizes, thickness, and type. Gypsum drywall is manufactured and distributed by many international manufacturers.

Prior art reveals a plurality of methods and practices for the manufacture of gypsum wallboard with varying technique and apparatus, such as U.S. Pat. No. 4,288,263 (1981); U.S. Pat. No. 5,116,671 (1992); U.S. Pat. No. 4,392,896 (1983); and U.S. Pat. No. 5,116,671 (1992). Additional U.S. patents and publications include U.S. Pat. Nos. 1,372,478; 2,728,702; 3,336,710; 4,862,662; 5,251,917; 8,398,024; 8,490,362; 8,661,757; US20080345923; US20120240504.

Every 24 seconds, a U.S. fire department responds to a fire somewhere in the nation. Fire occurs in a structure at the rate of one every 64 seconds, and a home fire occurs every 86 seconds. Fires occur in highway vehicles at the rate of one every 3 minutes 8 seconds, and there is a fire in an outside and other property every 52 seconds. Fire-resistant construction materials can play an important role in helping to reduce fire incidence.

Drywall is relatively fire resistant as it is composed of gypsum, which is not flammable, pressed between two sheets of thick paper. Additionally, water is incorporated into its structure. In the presence of fire, heat energy vaporizes the water, removing it gradually. Water effectively blocks the transfer of heat through the drywall. Once the water dissipates, the gypsum begins to heat past the boiling point of water, and may begin to burn. Some drywall manufacturers add glass fibers to the gypsum, which increases fire resistance of drywall. The glass fibers are non-combustible and help maintain the integrity of the drywall as it is dehydrated. The fiber-added drywall is also called fire wall. Type X fire wall ⅝-inch thick on both sides of a 2×4 studded wall should provide about 1 hour of fire protection. Type C fire wall has even better fire protection.

However, the existing drywall or fire wall is not completely fire proof and can only sustain a range of temperatures from 80° to 170° C. Accordingly, there is an established need for a drywall that provides complete fire proof and that has added value without substantial additional cost.

SUMMARY OF THE INVENTION

The present invention is directed to a practical and cost effective way of manufacturing a fire proof wallboard that can provide complete fire protection and that can also shield radiation. The fire proof wallboard manufactured according to the present invention can sustain a heat temperature of 3200° F. to 3623° F. applied with a torch without heat being transferred to the other side of the wall. The fire proof wallboard can also provide radiation protection proven by using EMP electromagnetic radiation.

The present invention can be applied to any drywall wallboard or fire barrier used in construction of interior walls and ceilings. Specifically, the new material $MgSO_4.7H_2O$) ($Mg_4Si_6O_{15}(OH)_2.6H_2O$) CaO (s)+$H_2O$ (l)$\leftrightarrows$Ca(OH)$_2$ (aq) ($\Delta H_r$=−63.7 kJ/mol of CaO) ($CaSO_4.2H_2O$) $H_4Mg_2Si_3O_{10}$) can be added to the gypsum substrate of a wallboard during the manufacturing process for creating a fire proof wallboard. This material can also be added to make fire proof paint or any other materials. An existing wallboard manufacturing process line could be modified to accept the additional process of adding $MgSO_4.7H_2O$) ($Mg_4Si_6O_{15}(OH)_2.6H_2O$) CaO (s)+$H_2O$ (l)$\leftrightarrows$Ca(OH)$_2$ (aq) ($\Delta H_r$=−63.7 kJ/mol of CaO) ($CaSO_4.2H_2O$) $H_4Mg_2Si_3O_{10}$) during the board forming process. Utilizing an existing line for the manufacture of "standard" and "fire wall" board would be very effective for the fire proof.

Introducing a first embodiment of the invention, the present invention consists of a fire proof compound having a fire proof property, comprising:

MgSO4.7H2O)(Mg4Si6O15(OH)2.6H2O)CaO(s)+
H2O(l)$\leftrightarrows$Ca(OH)2(aq)($\Delta H_r$=−63.7 kJ/mol of
CaO)(CaSO4.2H2O)H4Mg2Si3O10).

In another aspect, the compound is in a liquid state in the solvent with alcohol of 15% of MgS04.7H20) 15% of (Mg4Si6O15(0H)2.6H2O) 5% of CaO (s)+$H_2O$ (l)$\leftrightarrows$Ca(OH)2 (aq) ($\Delta H_r$=−63.7 kJ/mol of CaO and 5% of ($CaSO_4.2H_2O$) $H_4Mg_2Si_3O_{10}$).

In another aspect, the compound consists of 97% of MgS04.7H20) 1% of (Mg4Si6O15(OH)2.6H2O) 1% of CaO (s)+$H_2O$ (l)$\leftrightarrows$Ca(OH)2 (aq) ($\Delta H_r$=−63.7 kJ/mol of CaO and 1% of ($CaSO_4.2H_2O$) $H_4Mg_2Si_3O_{10}$).

In another aspect, the compound exhibits an electromagnetic field blocking property.

In another aspect, the compound is added to a gypsum substrate of a wallboard so the wallboard exhibits a fire proof property In another aspect, the compound is mixed in a paint so the paint exhibits a fire proof property.

In another aspect, the compound is utilizable in shielding heat in engines, muffler & exhaust systems, car interiors, fireplaces, satellites, and other heat sources, in preventing fire hazards, as well as in blocking radiation.

Introducing another embodiment of the invention, the present invention consists of a fire proof wallboard, comprising:

a gypsum substrate being added with a compound $MgSO_4.7H_2O$) ($Mg_4Si_6O_{15}(OH)_2.6H_2O$) CaO (s)+$H_2O$ (l)$\leftrightarrows$Ca(OH)$_2$ (aq) ($\Delta H_r$=−63.7 kJ/mol of CaO) ($CaSO_4.2H_2O$) $H_4Mg_2Si_3O_{10}$).

In another aspect, the percentage of the compound added depends on a function and/or purpose of the wallboard.

In another aspect, the compound consists of 97% of MgS04.7H20) 1% of (Mg4Si6O15(OH)2.6H2O) 1% of CaO (s)+$H_2O$ (l)⇋Ca(OH)2 (aq) ($\Delta H_r$=−63.7 kJ/mol of CaO and 1% of ($CaSO_4$.2H2O) $H_4Mg_2Si_3O_{10}$) so that the fire proof wallboard can also block electromagnetic field Introducing yet another embodiment of the invention, the present invention consists of a method of manufacturing a fire proof wallboard, comprising:

providing a wallboard having a gypsum substrate; and
adding a compound including MgSO4.7H2O) (Mg4Si6O15(OH)2.6H2O) CaO (s)+$H_2O$ (l)⇋Ca(OH)$_2$ (aq) ($\Delta H_r$=−63.7 kJ/mol of CaO) ($CaSO_4$.2H2O) $H_4Mg_2Si_3O_{10}$) to the gypsum substrate.

In another aspect, an existing wallboard manufacturing process line could be modified to accept the additional process of adding the compound to the gypsum substrate.

These and other objects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, where like designations denote like elements, and in which.

Like reference numerals refer to like parts throughout the several views of the drawings.

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims.

It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Shown throughout the figures, the present invention is directed toward a practical and cost effective fire proof wallboard that is capable of being complete fire proof as well as blocking magnetic field.

Figure 1:
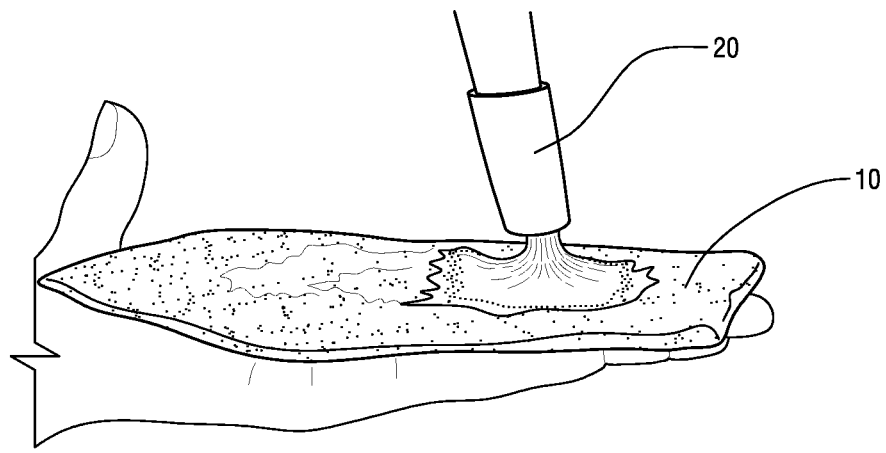
FIG. 1 presents a perspective front view illustrating a typical testing of a fire wall panel with a torch producing a heat of 3623° F.

Referring now to FIG. 1, a typical testing of a fire wall panel 10 with a torch 20 producing a heat of 3623° F. is illustrated. The fire wall can be a napkin where the gypsum panel is not fire proof at either end in this most common configuration. Other configurations with fire wall panel heat shield or radiation panel can be developed to accommodate specific or custom requirements.

Figure 2:
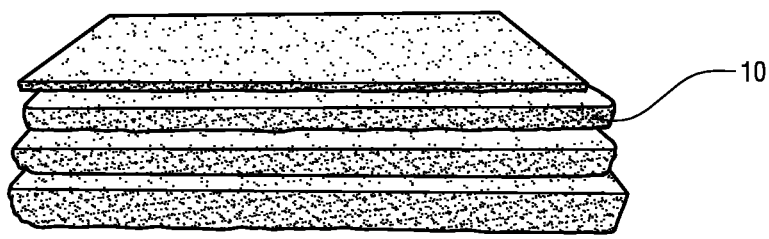
FIG. 2 presents a perspective view of test sized fire wall panels having a ¼", ⅓", and ½" inch thickness respectively, illustrating the typical side of the panels.
Figure 3:
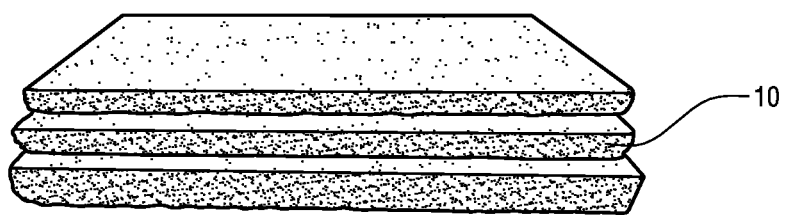
FIG. 3 presents a perspective view of fire wall panels in combination.
Figure 4:
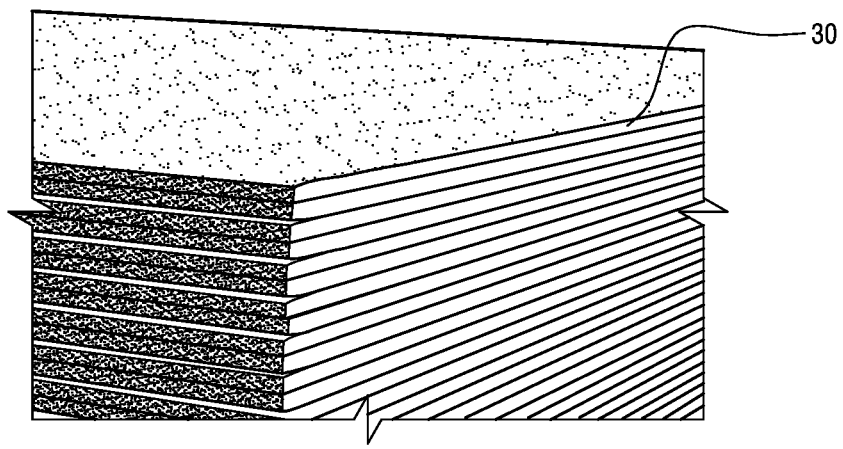
FIG. 4 presents a perspective view of a standard gypsum panel of an existing gypsum wallboard.

Referring now to FIGS. 2-4, test sized fire wall panels 10 having different thicknesses are illustrated in FIGS. 2-3, while FIG. 4 a standard gypsum panel 20 of an existing gypsum wallboard is illustrated in FIG. 4.

Figure 5:
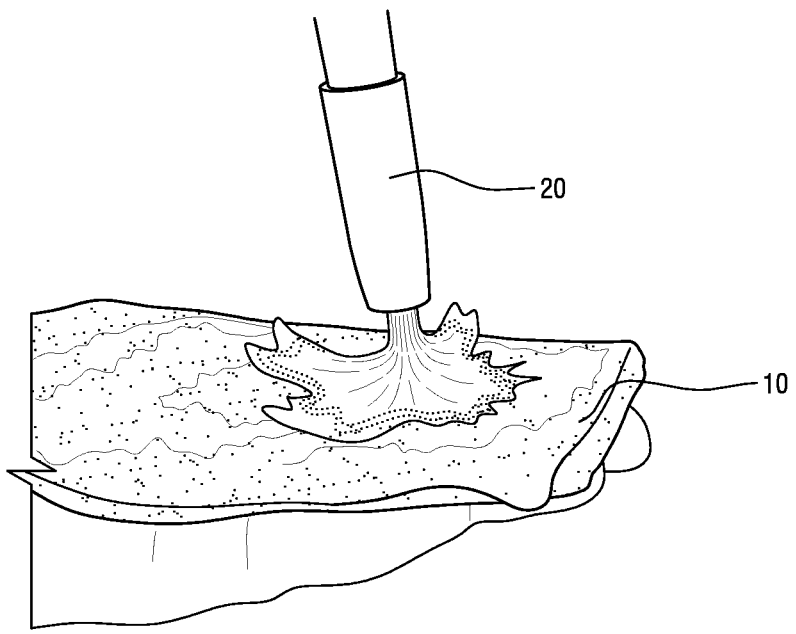
FIG. 5 presents a perspective side view of a small sized napkin fire wall panel illustrating the typical firewall material for the purpose of firewall board to be 100% fire proof.

Referring now FIG. 5, a small sized napkin fire wall panel 10 is shown as being tested by heat generated by a torch 20.

Figure 6:
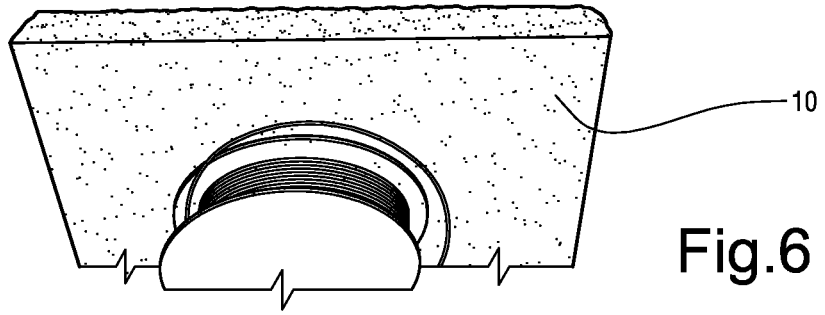
FIG. 6 presents a perspective side view of a standard small sized fire wall panel illustrating the typical firewall material testing with electromagnetic pulse testing that it blocks the magnetic field.

Referring now to FIG. 6, a standard small sized fire wall panel is illustrated being tested with electromagnetic pulse for testing that it blocks magnetic field.

The present invention focuses primarily on wall panels constructed of gypsum and cardboard, but also has applications to other panels used in similar applications, which are constructed of similar, but not identical materials. The present invention creates a new application to standards drywall by adding MgSO4.7H2O) (Mg4Si6O15(OH)2.6H2O) CaO (s)+$H_2O$ (l)⇋Ca(OH)$_2$ (aq) ($\Delta H_r$=−63.7 kJ/mol of CaO) ($CaSO_4$.2H2O) $H_4Mg_2Si_3O_{10}$) properties of the fire wall panel. The complete, finished product would show no apparent difference to the consumer. A fire wall panel and standard drywall panel would look identical in every respect and fire wall panels would be used in similar applications as standard drywall panels. In most applications, the fire wall panels would be used in the construction of interior walls, but would also have applications as radiation block panels and/or can be treated with paint, wallpaper, or coverings in a normal fashion. After fire wall panels are treated with the final cosmetic paint or wallpaper, the panel can be utilized as a surface to apply to a wide variety of areas that contain a flat surface in a similar fashion as it would in fact act as a fire wall board. For a new home, school or office, it can be constructed same as drywall.

The compound formula was tested on increasing percentage of formula on household items such an ordinary napkin that was used layer by layer, exposed to high heat from a blowtorch temperature is 3,623 F. Further is was tested on panels ¼ inch thick with increasing percentage of compound—depending on the function and purpose of the medium used. Each test on this novel discovery showed no effect from high heat. The compound was also tested in liquid state in a solvent with alcohol of 15% of MgS04.7H20) 15% of (Mg4Si6O15(OH)2.6H2O) 5% of CaO (s)+$H_2O$ (l)⇋Ca(OH)2 (aq) ($\Delta H_r$=−63.7 kJ/mol of CaO and 5% of ($CaSO_4$.2H2O) $H_4Mg_2Si_3O_{10}$) turned in to white sludge. This test mixed with paint demonstrates that the paint is fire resistant. Further, test showed 97% of MgS04.7H20) 1% of (Mg4Si6O15(OH)2.6H2O) 1% of CaO (s)+$H_2O$ (l)⇋Ca(OH)2 (aq) ($\Delta H_r$=−63.7 kJ/mol of CaO and 1% of ($CaSO_4$.2H2O) $H_4Mg_2Si_3O_{10}$) blocks the electromagnetic field. The reason for this novel discovery is due to test of the magnetic field, FWP as follows: MgS04.7H20) 5 to 15% (Mg4Si6O15(OH)2.6H2O) 20 to40% CaO (s)+$H_2O$ (l)⇋Ca(OH)2 (aq) ($\Delta H_r$=−63.7 kJ/mol of CaO 20 to 40% (CaSO$_4$.2H$_2$O) H4 Mg$_2$Si$_3$O$_{10}$) 30 to 60% depends on flexibility requirements for properties of the fire wall panel.

During the fire wall manufacturing process, material for the finished cardboard-covering is applied by adhesive means directly to the top of the interior surface. This task is performed and tested during the inspection of the fire wall, and like a drywall panel reveals no visible difference between the fire wall panel and a standard drywall panel. The only apparent difference would be in the slight increase of weight in the fire wall panel.

The size of the fire wall panel can vary according to its application. It is anticipated that the most common application of the board would be like any other panel when it is positioned in a normal vertical location. Horizontally installed panels can also accommodate building requirements.

The fire wall panel would not significantly affect or interfere with standard and accepted methods and practices of fire wall, erecting or contouring drywall. Nails, screws, and adhesive can be used in a normal fashion.

New fire wall panels after installation can be treated with paint, wallpaper, or coverings in a normal fashion.

If desired, new fire wall panels can be used at any place where fireproofing is desired or where other fireproofing requirements are needed. Other uses for the fireproofing can be use in vehicles, airplanes, homes, offices, schools, and innumerable other applications. In fact, the addition of the fire wall improved and creates a stronger surface.

Fire wall panels can be made to any size or shape depending on the dimension or orientation of the required panel, or the amount of surface required for application. Tests have confirmed that the covering with fire wall panel with its normal covering paper and the cosmetic covering of paint or wallpaper do not interfere with the application type and shape of itself, and the new fire wall board is electromagnetic proof also. Testing indicates that magnetic field is weak or can be completely electromagnetic proof. Closings and other similar activities do not affect the strength.

The key to the present invention is quality material. Tests have confirmed that the fire wall panels are 100% fire proof. For lightweight objects that are used in everyday applications, the fire wall board would provide the consumer a choice presently not available between standard fire wall wallboard during the construction stage of a building or addition. Families would find the fire wall board very safe would be fire proof and can completely replace standard wallboard for all wall board uses. Education and introduction to fire wall board would account for approximately 30% more than wallboard market. Due to value added qualities, producers of fire wall panel would be able to charge consumers a premium product. Standard wallboard is a commodity with a great deal of competition between producers. The market for wallboard continues to grow with no apparent cost effective replacement in sight. There is very little difference in product or in wholesale and retail pricing of fire wall board between manufacturers. Because of this factor, a producer of fire wall panel would be able to differentiate and clearly establish as an innovator. The premium of fire wall board would allow a producer to realize a relatively short period of time return on investment of R&D, and process line modifications. This is a product that appeals to the consumer. The present invention allows producers of fire wall board to refine the invention and introduce it to the marketplace.

The present invention has applications primarily on wall panels constructed of gypsum and cardboard, but has applications to other panels used in similar applications, which are constructed of similar, but not identical materials. The present invention describes a concept that addresses the creation of a new application of standards drywall or any other fire resistant, shield or material by adding MgSO4.7H2O) (Mg4Si6O15(OH)2.6H2O) CaO (s)+H$_2$O (l)⇋Ca(OH)$_2$ (aq) ($\Delta H_r$=−63.7 kJ/mol of CaO) (CaSO$_4$.2H2O) H$_4$Mg$_2$Si$_3$O$_{10}$) properties of a fire wall panel. Completed, finished product would show no apparent difference to the consumer. A fire wall panel and a standard drywall panel would look identical in every respect. Fire wall panels would be used in similar applications as standard drywall panels. This section describes two processes of inserting a MgSO4.7H2O) (Mg4Si6O15(OH)2.6H2O) CaO (s)+H$_2$O (l)⇋Ca(OH)$_2$ (aq) ($\Delta H_r$=−63.7 kJ/mol of CaO) (CaSO$_4$.2H2O) H$_4$Mg$_2$Si$_3$O$_{10}$) gypsum or similar material fire wall board panel during the manufacturing process.

For the purpose of this description, it is desired that the new fire wall board process be described as the most common like any other sheets or fire resistant materials. It is understood that the process of sheets of other perimeter and thickness dimension could be modified to accomplish the intention of the present invention.

It is highly desirable that an existing wallboard manufacturing process line could be modified to accept the additional process of by adding MgSO4.7H2O) (Mg4Si6O15(OH)2.6H2O) CaO (s)+H$_2$O (l)⇋Ca(OH)$_2$ (aq) ($\Delta H_r$=−63.7 kJ/mol of CaO) (CaSO$_4$.2H2O) H$_4$Mg$_2$Si$_3$O$_{10}$) during the board forming process. Utilizing an existing line for the manufacture of "standard" and "fire wall" board would be very effective for the fire proof.

Fire wall board may in fact utilize completely different properties and composition for technical or marketing purposes.

The material and the application process of manufacturing "fire wall" board is identical to the manufacture of "Standard" wallboard.

In a second process, the new material can be mixed directly in a paint, making fire proof paint alternative which solves several problems.

The placement of the new material into the board substrate would not affect the structural integrity of the wallboard in its final application. Fire wall board generally is fragile when handled roughly. Most of its collective strength is supported and reinforced by the handling properties of fire wall board. The only physical difference would be the slight increase in overall weight. The increase in weight would not affect the fire wall board's performance in any known application.

Fire wall board is handled in the same fashion as standard wallboard. In most applications, the fire wall board is directed specifically toward flat whole wall sections where the use of fire wall board configurations would be recommended to save life. If money is not a factor, fire wall board could be utilized in every application that standard wallboard is used. In most cases installing fire wall board instead of standard wall board would adequately perform the task and outperforms the standard board in conforming to fire code. In fact, fire wall board is fire proof.

All the materials for the fire wall board are commercially available. see the following Chemical Composition:

Chemical Composition (1)

($CaSO_4.2H_2O$)

mineral most commonly found in layered sedimentary deposits in association with halite, anhydrite, sulfur, calcite, and dolomite. ($CaSO_4.2H_2O$) is very similar to Anhydrite ($CaSO_4$). The chemical difference is that ($CaSO_4.2H_2O$) contains two waters and Anhydrite without water.

Category Sulfate mineral
Formula (repeating unit) $CaSO_4.2H_2O$
Classification: 07.CD.40
Crystal system: Monoclinic 2/m-Prismatic
Unit Cell: a=5.679(5) Å, b=15.202(14) Å, c=6.522(6) Å; β=118.43°; Z=4

Chemical Composition (2)

CaO (CaO) is a caustic alkaline crystalline chemical compound. It is a white broadly used connotes calcium-containing inorganic materials, in which carbonates, oxides and hydroxides of calcium, silicon, magnesium, aluminum, and iron predominate. Both this and a chemical are important commodity chemicals formation of the hydrate by the following equation:

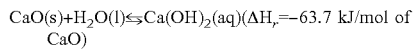

$CaO(s)+H_2O(l) \leftrightarrows Ca(OH)_2(aq)(\Delta H_r=-63.7$ kJ/mol of CaO)

Formula: CaO
IUPAC ID: Calcium oxide
Molat mass: 56.0774 g/mol
Meting point: 4,662° F. (2,572° C.)
Boiling point: 5,162° F. (2,850° C.)
Density: 3.35 g/cm³

As it hydrates, an exothermic reaction results and the solid puffs up. The hydrate can be reconverted. There is archeological evidence that humans used for flooring and other uses. Such remained in use until the late nineteenth century. Chemical or power production: Solid sprays or slurries of calcium oxide Chemical Composition (3)

($Mg_4Si_6O_{15}(OH)_2.6H_2O$)

Magnesium silicate clay mineral with composition $Mg_4Si_6O_{15}$ (OH) $2.6H_2O$ is a clay-like hydrous magnesium silicate. It has no crystals, and occurs as earthy aggregates, porcellanous masses, nodular, and porous. In the fresh state, it is soapy and soft, but hard when dried.

| Fiber type | Specific gravity | Tensile strength |
|---|---|---|
| longitudinal fiber | 2.0-3.2 | 892.4-1283.7 MPa (medium strength) |
| Terminal conductivity | Electrical resistivity | Heat resistance |
| 0.038-0.046 W/m · K | Pv = 5.9 × 10⁶ (Ω · cm) | Dehydration temperature: 400-500° c. Melting point: 1500-1700° c. |

| Chemical Composition | | | | | |
|---|---|---|---|---|---|
| Sample No | Test I term | Unite | Method | Results | MDL |
| SD1406072 | SiO2 | % | EDXF | 58.09 | 0.05 |
| | Al2O3 | % | | 0.09 | 0.05 |
| | Fe2O3 | % | | <0.05 | 0.05 |
| | CaO | % | | 10.67 | 0.05 |
| | MgO | % | | 28.24 | 0.05 |
| | TiO2 | % | | >0.05 | 0.05 |

| Asbestos Test | | | | |
|---|---|---|---|---|
| Test Item | CAS NO | Unit | MDL | Result |
| Actinolite | 077536-66-4 | % (w/w) | 0.1 | Negative |
| Amosite | 012172-73-5 | % (w/w) | 0.1 | Negative |
| Anthophylite | 077539-67-5 | % (w/w) | 0.1 | Negative |
| Chrysotile | 012001-29-5 | % (w/w) | 0.1 | Negative |
| Crocidolite | 012001-28-4 | % (w/w) | 0.1 | Negative |
| Tremolite | 077536-68-6 | % (w/w) | 0.1 | Negative |

Chemical Composition (4)

(MgSO4.7H2O)

Name: Magnesium Sulfate Heptahydrate
Alias: Formula: MgSO4.7H2O
Molar Mass: 246.4746 MgSO4.7H2O It is a white crystal. It is soluble in water density 2.66 g/cm3. MgSO4.7H2O may dehydrate at room temperature. Magnesium sulphate is an inorganic chemical containing magnesium and oxygen with the formula $MgSO_4$. It is often encountered as the heptahydrate sulfate mineral epsomite ($MgSO_4.7H_2O$), clay. The monohydrate, $MgSO_4.H_2O$ is found as the mineral kieserite, the majority of which was used in agriculture.

Anhydrous magnesium sulfate is used as a drying agent. The anhydrous form is hygroscopic (readily absorbs water from the air) and is therefore difficult to weigh accurately; the hydrate is often preferred when preparing solutions (for example, used in medical preparations).

To increase the resistance to fires mix with paint. Many solvent dissolves a wide range of non-polar compounds. It also evaporates quickly, leaves nearly zero oil traces, compared to ethanol, and is some solvents relatively non-toxic, compared to alternative solvents. Thus, it is used widely as a solvent and as a cleaning fluid, especially for dissolving oils. Together with ethanol, butane, and methanol, it belongs to the group of alcohol solvents, about 6.4 million tones of which were utilized worldwide Application In a drywall, wallboards, engine heat shield, muffler & exhaust, fire place shielding. In liquid can be used for forest fire, sub floor shielding. In most paint, cars interior heat shielding, aircraft heat shield, in Aerospace application, heat shield and radiation shielding, satellite heat shield and radiation, military application, boat heat shield, ship heat shield, blanket-type insulation, the radiant barrier, and radiation barrier.

In Paint

Paint can be applied as a solid, a gaseous suspension, or a liquid. Techniques vary depending on the practical or results desired.

In the liquid application, dissolving (MgSO4.7H2O) (Mg4Si6O15(OH)2.6H2O) CaO (s)+H$_2$O (l)⇌Ca(OH)$_2$ (aq) ($\Delta H_r$=−63.7 kJ/mol of CaO) (CaSO$_4$.2H$_2$O) before adding into the paint after paint can be applied by direct application, or other.

Allowing painting at different heights. Generally, requires two coats for even color used to apply paint on uneven surfaces. In drywall application formula is slightly different.

After liquid paint is applied, there is an interval during which it can be blended with additional painted regions. Oil or alkyd-based emulsion paint can be extended by adding similar glycols such as Dowanol (propylene glycol ether) or open time prolongers. This can also facilitate the mixing of different wet paint layers for aesthetic effect, such as Latex and acrylic emulsions.

Many paints tend to separate when stored, the heavier components settling to the bottom, and require mixing before use. Some paint outlets have machines for mixing the paint by shaking the can vigorously for a few minutes; application mechanism is air depositing a layer of primer. The opacity and the film thickness of paint may be measured. Water-based paints tend to be the easiest to use; the brushes and rollers can be cleaned with soap and water. It contains no prohibited substances. Disposal of liquid paint usually requires special handling and should be treated as hazardous waste, and disposed of according to local regulations.

Heat Shield

Features: Continuous operating temperature of 3200 F, intermittent, Reduces radiant heat by 90% percent, ¼ inch thick armor layer installation. The ideal heat shield insulation for high Operational Temperature: 3200 to 3623 peak. Temperature can be placed in direct contact with heat source. Heat shield Armor reduces up to 90 percent. This shield allows it to be rated for. 3,623 degrees Fahrenheit heat wraps, engine compartment heat insulation with fire wall panel armor, heat shield armor. Heat shield Armor reduces radiant heat from fire 100%. The outer armor of this heat shield after installation, Heat shield Armor resistant to the any fire capable of withstanding 3623 degrees Fahrenheit continuous, which allows this heat shield to be placed directly on headers system which creates a scavenging effect, prevents radiant heat from entering the any compartment or room and stops radiant heat damage to other components or area. ¼ inch thick fire wall panel heat shield armor for forced induction for many applications.

Since many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalents.

What is claimed is:

1. A fire proof composition, comprising
MgSO$_4$.7H$_2$O,
Mg$_4$Si$_6$O$_{15}$(OH)$_2$.6H$_2$O,
CaO(s),
H$_2$O(l),
Ca(OH)$_2$(aq),
CaSO$_4$.2H$_2$O, and
H$_4$Mg$_2$Si$_3$O$_{10}$.

2. The fire proof composition of claim 1,
wherein the composition is in a liquid state in a solvent with alcohol,
wherein:
MgSO$_4$.7H$_2$O is present in an amount of 15%,
Mg$_4$Si$_6$O$_{15}$(OH)$_2$.6H$_2$O is present in an amount of 15%,
CaO(s) is present in an amount of 5%, and
CaSO$_4$.2H$_2$O is present in an amount of 5%.

3. A fire proof wallboard, wherein the wallboard comprises gypsum substrate that comprises the composition of claim 1.

4. The fire proof wallboard of claim 3, wherein the wallboard is fire proof.

5. The fire proof wallboard of claim 3,
wherein the composition is in a liquid state in a solvent with alcohol, and
wherein:
MgSO$_4$.7H$_2$O is present in an amount of 15%,
Mg$_4$Si$_6$O$_{15}$(OH)$_2$.6H$_2$O is present in an amount of 15%,
CaO(s) is present in an amount of 5%, and
CaSO$_4$.2H$_2$O is present in an amount of 5%.

6. The fire proof composition of claim 1, wherein the composition is mixed in a paint.

7. The fire proof composition of claim 6, wherein the paint is fire proof.

8. The fire proof composition of claim 1, wherein the composition: (a) shields heat thereby preventing fire hazards, and (b) blocks radiation, in engines, muffler and exhaust systems, car interiors, fireplaces, satellites, and other heat sources.

9. A method of manufacturing a fire proof wallboard, comprising:
providing a wallboard having a gypsum substrate; and
adding a to the gypsum substrate a composition comprising:
MgSO$_4$.7H$_2$O,
Mg$_4$Si$_6$O$_{15}$(OH)$_2$.6H$_2$O,
CaO(s),
H$_2$O(l),
Ca(OH)$_2$(aq),
CaSO$_4$.2H$_2$O, and
H$_4$Mg$_2$Si$_3$O$_{10}$.

10. The method of claim 9, wherein the composition is added in a liquid state in a solvent with alcohol, and
wherein:
MgSO$_4$.7H$_2$O is present in the composition in an amount of 15%,
Mg$_4$Si$_6$O$_{15}$(OH)$_2$.6H$_2$O is present in the composition in an amount of 15%,
CaO(s) is present in the composition in an amount of 5%, and
CaSO$_4$.2H$_2$O is present in the composition in an amount of 5%.

11. The method of claim 9, further comprising the step of modifying an existing wallboard manufacturing process line to accept the additional step of adding the composition to the gypsum substrate.

* * * * *